(12) United States Patent
Kajjam et al.

(10) Patent No.: US 10,073,119 B2
(45) Date of Patent: Sep. 11, 2018

(54) APPARATUS TO TAP THE ELECTRICAL SIGNALS IN PROCESS CONTROL WITHOUT BREAKING THE CONTINUITY

(71) Applicant: Honeywell International Inc., Morris Plains, NJ (US)

(72) Inventors: Praveen Kumar Kajjam, Telangana (IN); Murali Krishna Thavva.V.V, Telangana (IN); Jaganmohan Y. Reddy, Telangana (IN); Suresh Kumar Palle, Karnataka (IN); Suresh Babu D T V S Dogiparthi, Telangana (IN)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 111 days.

(21) Appl. No.: 15/077,240

(22) Filed: Mar. 22, 2016

(65) Prior Publication Data
US 2017/0276706 A1   Sep. 28, 2017

(51) Int. Cl.
*G01R 15/12* (2006.01)
*G01R 19/25* (2006.01)
*G01R 1/067* (2006.01)

(52) U.S. Cl.
CPC ......... *G01R 15/12* (2013.01); *G01R 19/2513* (2013.01); *G01R 1/06788* (2013.01)

(58) Field of Classification Search
CPC ...... G01R 13/16; G01R 31/2829; G01R 1/28; G01R 11/00; G01R 11/32; G01R 21/005; G01R 22/00; G01R 35/005; G01R 35/04; G01R 31/10; G05B 2219/37348; H01R 25/14; H01R 25/142; H01R 9/2608; H01R 9/2691; H01R 4/64; H01R 9/26
USPC ........... 324/113, 74, 111, 528; 439/716, 110, 439/121, 532
See application file for complete search history.

(56) References Cited

U.S. PATENT DOCUMENTS

| | | | | |
|---|---|---|---|---|
| 4,389,551 A | * | 6/1983 | Deibele | H01R 13/7035 200/50.31 |
| 5,199,878 A | * | 4/1993 | Dewey | H04Q 1/14 361/801 |
| 5,438,617 A | * | 8/1995 | Hill | H01R 13/7035 379/326 |
| 6,762,374 B2 | | 7/2004 | Pedrinelli et al. | |
| 7,101,231 B2 | | 9/2006 | Prokup et al. | |
| 7,922,521 B1 | | 4/2011 | Wu | |
| 8,545,277 B2 | | 10/2013 | Ondusko et al. | |

* cited by examiner

*Primary Examiner* — Tung X Nguyen
*Assistant Examiner* — Robert P Alejnikov, Jr.
(74) *Attorney, Agent, or Firm* — Richard H. Krukar; Kermit D. Lopez; Luis M. Ortiz (57) ABSTRACT

A monitor can be installed in the terminal block having a monitor access opening. The installed monitor allows for current measurement without having to disconnect a wire from the terminal block. Similar monitors can measure voltage, detect ground loops, and provide continuous readings of circuit parameters. Embodiments can positively hold probe tips, transmit data over wires, or transmit data wirelessly. Make-before-break monitors allow parameters to be measured without ever breaking the monitored circuit. Break-before-make monitors allow the monitored circuit to be interrupted and then reconnected with a monitor in place.

11 Claims, 6 Drawing Sheets

APPARATUS TO TAP THE ELECTRICAL SIGNALS IN PROCESS CONTROL WITHOUT BREAKING THE CONTINUITY

FIELD OF THE INVENTION

Embodiments are generally related to electric wiring, instrumentation signals, junction boxes, and terminal blocks.

BACKGROUND

Electrical terminal blocks provide a convenient way to pass electrical power or signals between individual electrical wires. A typical terminal block has one or more pairs of terminals with each pair being electrically connected. Each terminal has a connector, such as a machine screw, that can be tightened to hold a wire. An example of a prior art terminal block is shown in FIG. 1.

Figure 1:
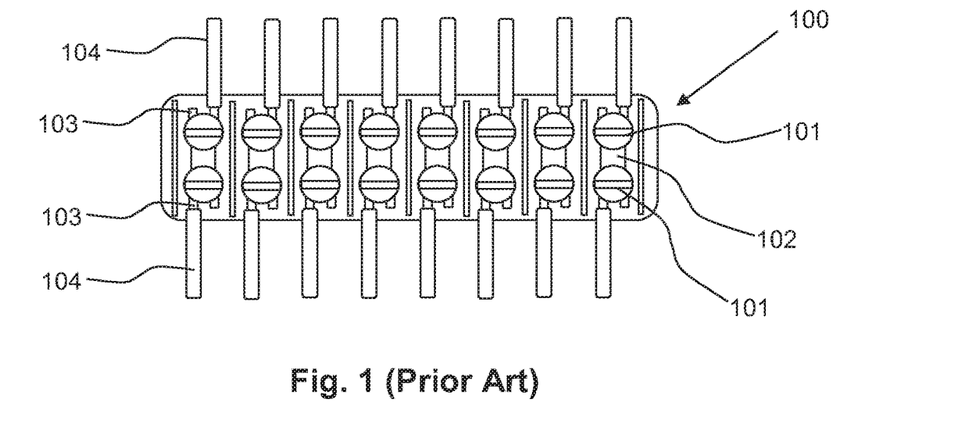
FIG. 1, labeled as prior art, illustrates one particular embodiment of a prior art terminal block.

FIG. 1 illustrates a terminal block 100. Terminal block 100 is an example of one style of terminal block, is presented to show aspects of prior art terminal blocks, and is non-limiting. The terminal block 100 has eight pairs of terminals. Each terminal pair has two screws 101 and a conductive strap 102. Each screw 101 holds a wire 103 against a conductive strap 102. The wire 103 has been stripped of insulation 104. Tightening the screw 101 causes the wire 103 to be clamped against the conductive strap 102 such that a voltage, signal, or current on one wire is conducted through the conductive strap to the other wire that is clamped into the other side of the terminal pair.

Many terminal blocks have exposed wiring or circuitry that provides for a probe tip to be pressed onto the circuitry such that voltages can be read with a meter. Such diagnostics are helpful, but are limited and awkward. Systems and methods for improving diagnostics at a terminal block are needed.

SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the embodiments that a terminal block has a monitor access opening into which a monitor can be installed. The terminal block has a first wire connected to a left side terminal and a second wire connected to a right side terminal. The terminal block contains internal circuitry that directly conducts electrical signals between the first wire and the second wire. Directly conducts means a physical and conductive connection that can pass direct current from the first wire to the second wire and from the second wire to the first wire. The monitor, once installed, is held in place by the terminal block and includes circuitry for measuring or detecting the signal characteristics of the electrical signals. The signal characteristics can be any one of or include voltage, current, frequency, or another parameter. The circuitry on the monitor can include probe points, communications circuits, and measurement circuits.

It is another aspect of the embodiments that the terminal block has a terminal block body, a left circuit, and a right circuit. The terminal block body has a front side, back side, left side, right side, a monitor access opening, a left wire opening, and a right wire opening. The left circuit can be substantially inside the left side of the terminal block body and can include a left terminal, a left conductor, and a left spring loaded switch. The right circuit can be substantially inside the right side of the terminal block body and can include a right terminal, a right conductor, and a right spring loaded switch. A first wire can be attached to the terminal block by passing the first wire through the left wire opening and attaching it to the left terminal. Similarly, the second wire can be attached to the terminal block by passing it through the right wire opening and attaching it to the right terminal.

The left circuit can physically touch the right circuit when no monitor is installed in the terminal block. As such, there is direct physical and electrically conductive contact between the first and second circuit. An electrical signal can pass from left terminal to left conductor, to left spring loaded switch, to right spring loaded switch, to right conductor, to right terminal, and finally to the second wire. Certain embodiments can have only one spring loaded switch. Spring loaded switches can perform two functions. One function is pressing into a contact or other conductive element to thereby ensure an electrical connection. The second function is holding the monitor in place.

An installed monitor disrupts the physical connection between the first circuit and the second circuit. There is a direct physical and electrically conductive contact between the first circuit and the monitor's circuitry. There is also a direct physical and electrically conductive contact between the second circuit and the monitor's circuitry. The monitor's circuitry can pass electrical signals between the first circuit and the second circuit. Electrical signals can be control signals, control outputs, and control inputs as well as power inputs for powering a machine or device.

As an example, line current can pass through the first wire, into the terminal block, through the monitor, out the second wire, and to a device. The power return from the device can also pass through the terminal block, but must obviously traverse a different terminal pair. The power return can also pass through a monitor installed in the terminal block. In some embodiments, the same monitor can be installed between two sets of terminal pairs in a single terminal block such that the monitor can measure the power input, the power return, and a differential between the power input and power return.

It is an aspect of the embodiments that the monitors are "break before make" or "make before break." The physical contact between the left circuit and right circuit is broken as the monitor is installed. Break before make means that the physical connection is broken before the electrical signal can pass through the monitor. As such, electrical communication between the first wire and second wire is briefly interrupted as the monitor is installed. Make before break means that the electrical signal can pass through the monitor and between the first circuit and the second circuit before the physical contact between the left and right circuits is broken. As such, electrical communication between the first wire and second wire is not interrupted as the monitor is installed.

It is a further aspect of the embodiments that the electrical signal can be measured. A monitor can provide a probe point that a measurement probe can be touched to such that a measurement can be made. Some probe tips can clamp onto suitable designed probe points. Some probe points can clamp onto a probe tip. Alternatively, a monitor can include measurement circuitry that can measure the voltage present on the first circuit, the voltage on the second circuit, or the current passing between the first and second circuit. The measurement can be communicated. Some monitors can have alphanumeric displays, bar displays, or other displays that indicate the measurements value. Some monitors can have indicators that light up or otherwise indicate that a signal (or power) is present, exceeds a certain value, is on, or is off. Some monitors can have circuitry for transmitting measured values to a receiver with the transmission being wired or wireless.

For example, a monitor can be inserted between two terminal pairs that provide AC line power and power return to a machine. The monitor can measure parameters including input line voltage, input line current, input frequency, return line voltage, return line current, return line frequency, phase difference between input and return, current difference between input and return, and voltage difference between input and return. Here, the monitor may be connected to a ground line or other ground reference. The monitor can display the measure parameters and can even have binary indicators showing that the machine is being powered and that there are no detectable ground faults. The monitor can also communicate the parameters, perhaps via WiFi, Bluetooth, or some other standardized wireless signal, to a smartphone or other device that can be configured to display, store, analyze, or alarm on the parameters as they change over time.

BRIEF DESCRIPTION OF THE FIGURES

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As used herein, the term "and/or" includes any and all combinations of one or more of the associated listed items.

A monitor can be installed on a terminal block having a monitor access opening. The installed monitor allows for current measurement without having to disconnect a wire from the terminal block. Similar monitors can measure voltage, detect ground loops, and provide continuous readings of circuit parameters. Embodiments can positively hold probe tips, transmit data over wires, or transmit data wirelessly. Make-before-break monitors allow parameters to be measured without ever breaking the monitored circuit. Break-before-make monitors allow the monitored circuit to be interrupted and then reconnected with a monitor in place.

Figure 2:
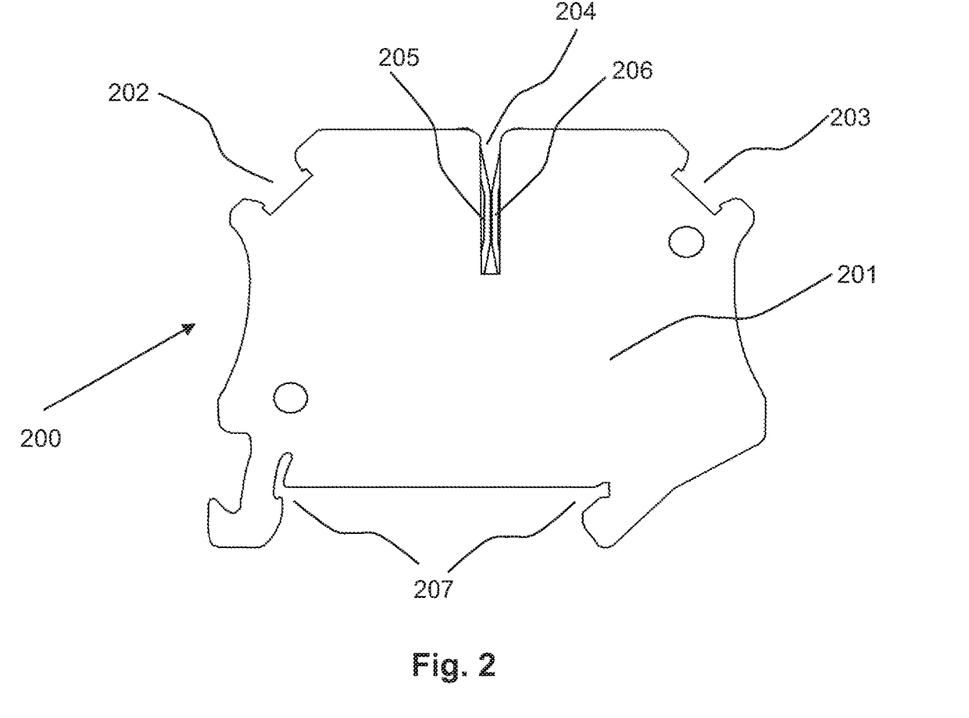
FIG. 2 illustrates a front view of a terminal block in accordance with aspects of the embodiments.

FIG. 2 illustrates a front view of a terminal block 200 in accordance with aspects of the embodiments. The terminal block has a terminal block body 201 with a left wire access opening 202 and a right wire access opening 203. A monitor can be inserted into the monitor access opening 204 and held in place by the left spring loaded switch 205 and the right spring loaded switch 206. The terminal block 200 can be mounted to a DIN rail at mounting point 207.

Figure 3:
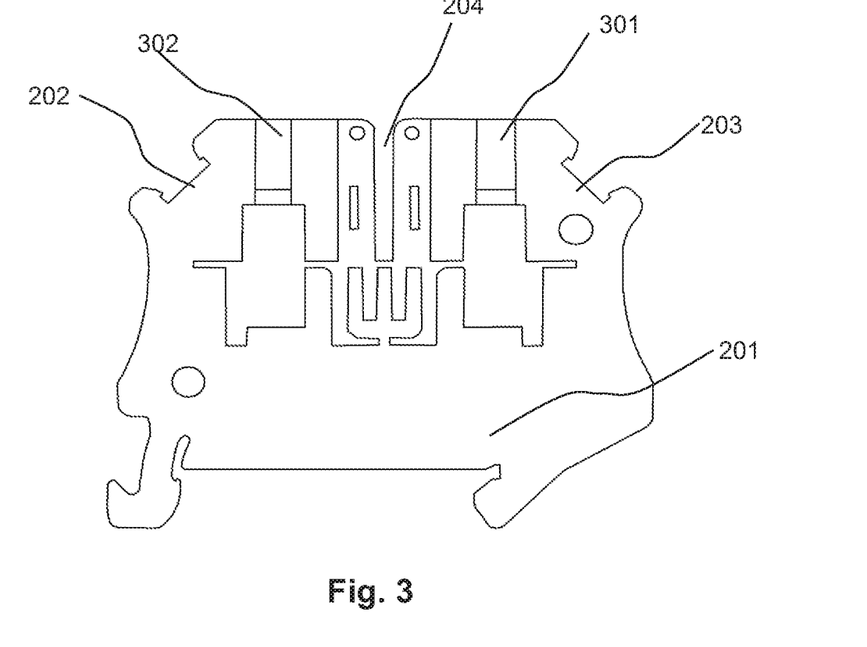
FIG. 3 illustrates a front view of a terminal block body with no front cover in accordance with aspects of the embodiments.

FIG. 3 illustrates a front view of a terminal block body 201 with no front cover in accordance with aspects of the embodiments. The terminal block body 201 has a left wire access opening 202 and a right wire access opening 203. A view of the structure around the monitor access opening 204 can be seen. The right terminal access opening 301 and left terminal access opening 302 can be seen. A person can insert a tool, such as a screwdriver, into the terminal access openings 301, 302 in order to operate terminals such that a wire is clamped or released.

Figure 4:
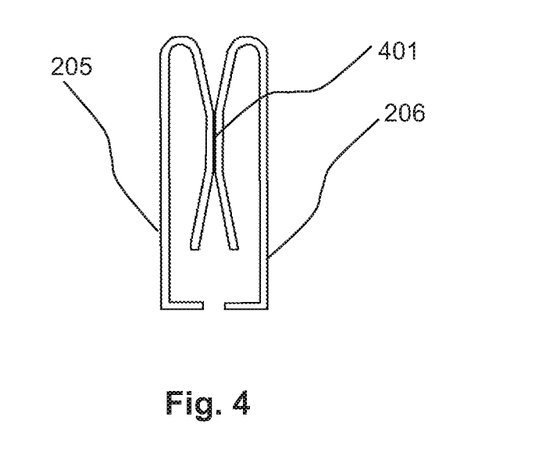
FIG. 4 illustrates a left spring loaded switch and a right spring loaded switch in accordance with aspects of the embodiments.

FIG. 4 illustrates a left spring loaded switch 205 and a right spring loaded switch 206 in accordance with aspects of the embodiments. The spring loaded switches 205, 206 are illustrated as they would be positioned inside of terminal block 200 with no monitor installed. The spring loaded switches are electrically conductive and are in physical contact with one another at inter-switch contact 401. The spring loaded switches 205, 206 are in direct electrical contact at inter-switch contact 401. Electrical current can flow between the spring loaded switches 205, 206 because they are in electrical contact.

Figure 5:
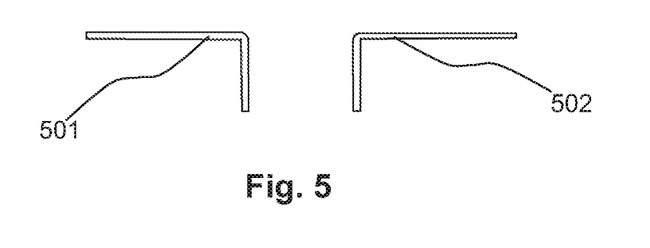
FIG. 5 illustrates a left conductor and a right conductor in accordance with aspects of the embodiments.

FIG. 5 illustrates a left conductor 501 and a right conductor 502 in accordance with aspects of the embodiments. The left and right conductors 501, 502 are illustrated as they would be positioned inside terminal block 200. The left and right conductors 501, 502 are circuit elements that conduct electricity between terminals 601, 602 and spring loaded switches 205, 206.

Figure 6:
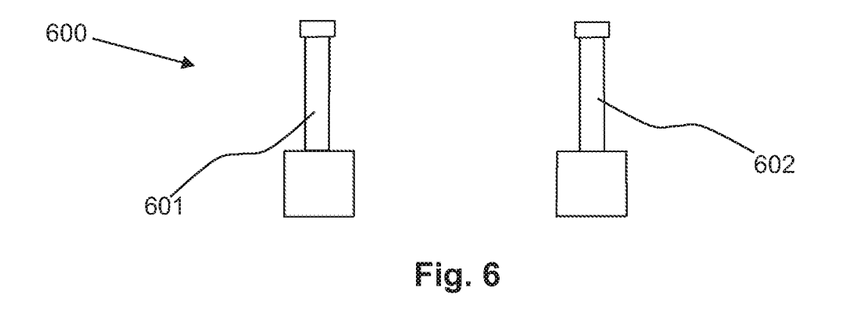
FIG. 6 illustrates a terminal pair having a left terminal and a right terminal in accordance with aspects of the embodiments.

FIG. 6 illustrates a terminal pair 600 having a left terminal 601 and a right terminal 602 in accordance with aspects of the embodiments. The left and right terminals 601, 602 are illustrated as they would be positioned inside terminal block 200. The left and right terminal 601, 602 are circuit elements that interface with outside wiring and conduct electricity between the outside wiring and the circuitry inside the terminal block 200.

Figure 7:
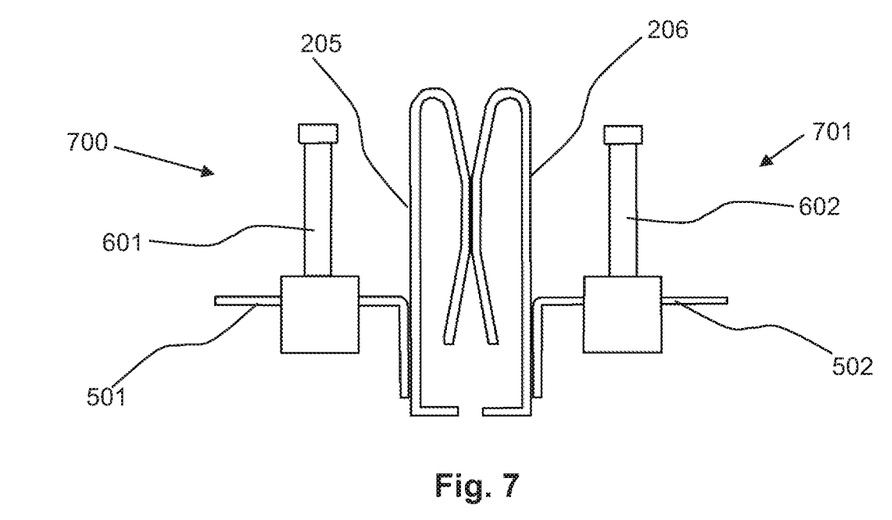
FIG. 7 illustrates a left circuit and a right circuit in accordance with aspects of the embodiments.

FIG. 7 illustrates left circuit 700 and a right circuit 701 in accordance with aspects of the embodiments. The left and right circuits 700, 701 are illustrated as they would be positioned inside terminal block 200. The left circuit 700 can be made up of elements such as the left terminal 601, left conductor 501, and left spring loaded switch 205. The right circuit can be made up of elements such as the right spring loaded switch 206, right conductor 502, and right terminal 602. As with the spring loaded switches of FIG. 4, the left and right circuits are illustrated as being in physical contact and in direct electrical contact where the spring loaded switches press together at inter-switch contact 401.

Figure 8:
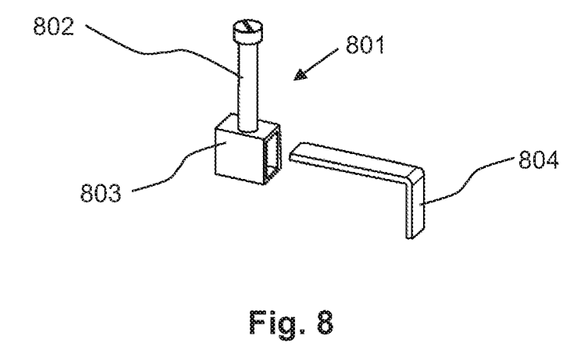
FIG. 8 illustrates a terminal and conductor in accordance with aspects of the embodiments.

FIG. 8 illustrates a terminal 801 and a conductor 804 in accordance with aspects of the embodiments. FIG. 8 provides a slightly different view than that provided in FIG. 6 such that certain aspects of some embodiments can be more clearly observed. The terminal 801 has a screw or bolt 802 and a block 803. The conductor 804 can be installed in the block 803 as seen in FIG. 7. A wire (not shown) can be placed in the block and the screw 802 tightened to force and clamp the wire and the conductor 804 together to form an electrical connection. It is by installing the wire in the block and tightening the screw 802 that the wire is put in electrical communication with the circuitry inside the terminal block. The particular terminal illustrated is a non-limiting example in that other terminals known in the art have other mechanisms for clamping onto the wire and forming an electrical connection. Those other terminals can also be used in the terminal block taught here and one practiced in the art of designing terminal blocks would see those other terminals as functional equivalents that could be used with little, if any, undue experimentation.

Figure 9:
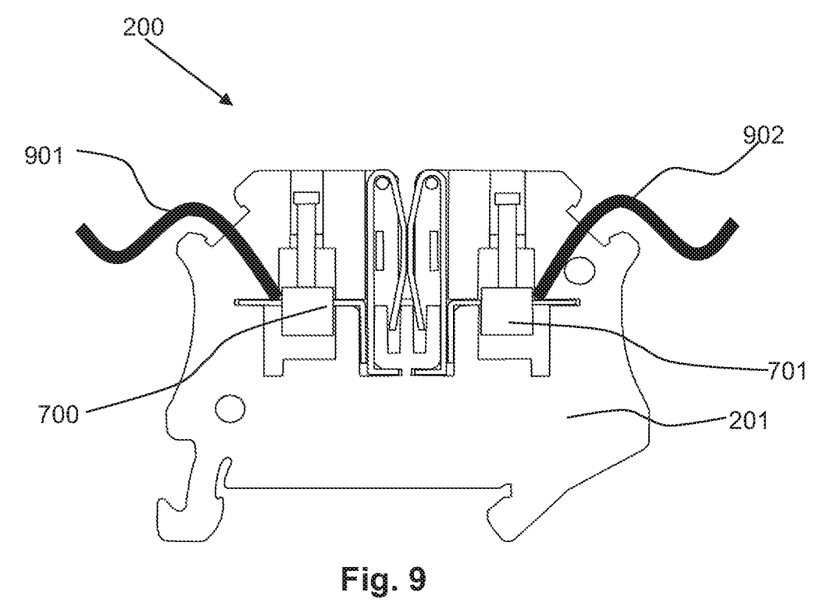
FIG. 9 illustrates a terminal block with front cover removed in accordance with aspects of the embodiments.

FIG. 9 illustrates a terminal block 200 with front cover removed in accordance with aspects of the embodiments. The illustrated terminal block has the left circuit 700 and right circuit 701 installed. A first wire 901 is installed into the left circuit 700. A second wire 902 is installed in the right circuit. The first wire 901 and the second wire 902 are in electrical communication because the first circuit 700 and second circuit 701 are in physical contact.

Figure 10:
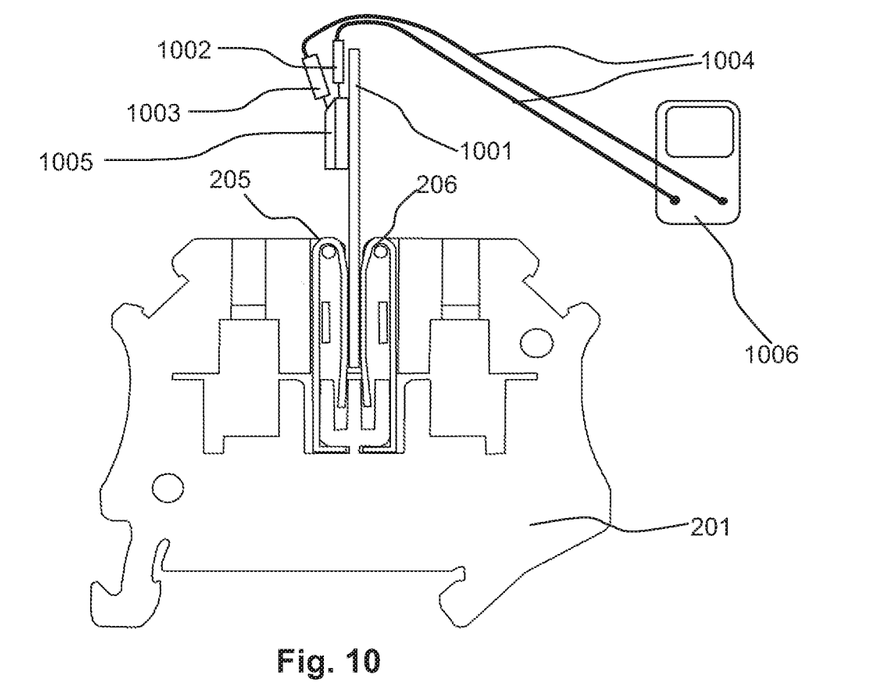
FIG. 10 illustrates a terminal block with an installed monitor in accordance with aspects of the embodiments.

FIG. 10 illustrates a terminal block with an installed monitor 1001 in accordance with aspects of the embodiments. For clarity, only the spring loaded switches 205 and 206 are shown installed in the terminal block body 201. It is understood that the rest of the first and second circuits 700, 701 as well as the wires 901, 902 are present, but not shown. A monitor 1001 has been installed between the spring loaded switches 205, 206 and is being held in place by the spring tension of the spring loaded switches 205, 206. Monitor 1001 has a connection block 1005 holding the probe tips of two probes 1002, 1003. Probe leads 1004 connect the probes 1002, 1003 to meter 1006. Depending on the monitor's circuitry, the meter can measure the voltage, current, or some other parameter of the electricity passing through the wires 901, 902 and terminal block 200.

Figure 11:
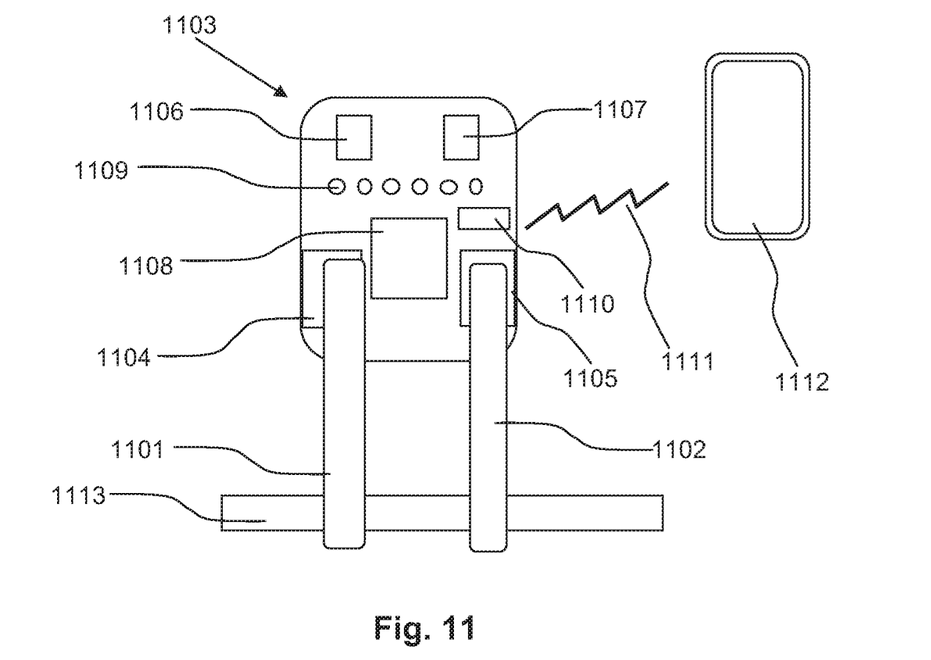
FIG. 11 illustrates terminal blocks with an installed monitor in accordance with aspects of the embodiments.

FIG. 11 illustrates terminal blocks 1101, 1102 with an installed monitor 1103 in accordance with aspects of the embodiments. The terminal blocks 1101, 1102 are mounted on a rail 1113 such as a DIN rail. Such a configuration can be used for powering a machine with, for example, terminal block 1101 carrying the "hot" or power line to the machine while terminal block 1102 carries the return line. Other configurations are possible with, for example, three terminal blocks carrying the phases of a three phase connection or a third block carrying chassis or earth ground. A monitor 1103 has been installed in the terminal blocks 1101, 1102 with pad 1104 electrically contacting the circuitry inside block 1101 and pad 1105 electrically contacting the circuitry inside block 1102. The far side of monitor 1103, which can't be seen, would have additional pads electrically contacting the circuitry inside the blocks 1101, 1102.

The pads 1104, 1105 can be electrically connected to probe pads/terminals 1106, 1107 or measurement circuitry 1108. Depending on its configuration, measurement circuitry can measure a variety of electrical parameters such as the current flowing through terminal block 1101, the current flowing through terminal block 1102, the voltage at pad 1104, the voltage at pad 1105, the voltage difference between the pads 1104, 1105, or the difference between the currents flowing in blocks 1101, 1102. The measurement circuitry can control LED lights 1109 to indicate measurement values, circuit status, or circuit faults. The measurement circuitry can communicate measurements, perhaps in digital form, to communication circuitry 1110 which can send a wireless signal 1111 to a receiving device 1112. The receiving device 1112 can be a smartphone, tablet computer, or other device that receives the signal 1111 and displays the measurement values, circuit status, or circuit faults.

Figure 12:
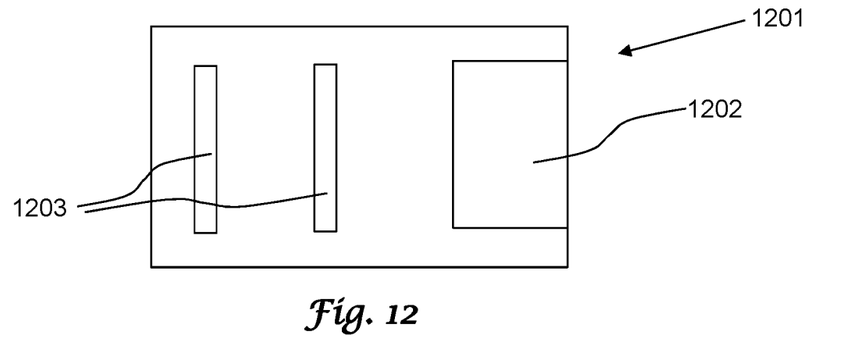
FIG. 12 illustrates a make-before-break monitor in accordance with aspects of the embodiments.

FIG. 12 illustrates a make-before-break monitor 1201 in accordance with aspects of the embodiments. The monitor 1202 can be installed into a terminal block 200 by pressing it, pads 1202 first, into the monitor access opening 204. The make-before-break monitor 1201 has pads 1202 (a second pad is on the far side of the monitor 1201) at the end of the monitor 1201 such that both pads 1202 physically contact the spring loaded switches 205, 206 before the spring loaded switches 205, 206 are pushed apart as the monitor is pressed into the block 200. As such, the first circuit 700 and the second circuit 701 inside the block 200 remain in electrical communication with each other as the monitor is installed.

Figure 13:
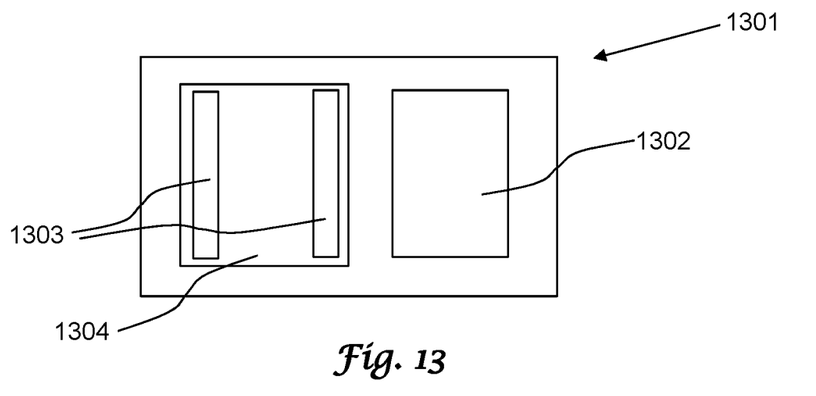
FIG. 13 illustrates a break-before-make monitor in accordance with aspects of the embodiments.

FIG. 13 illustrates a break-before-make monitor 1301 in accordance with aspects of the embodiments. The monitor 1301 can be installed into a terminal block 200 by pressing it, pads 1302 first, into the monitor access opening 204. The break-before-make monitor 1301 has pads 1302 (a second pad is on the far side of the monitor 1301) spaced away from the end of the monitor 1301 such that the spring loaded switches 205, 206 are pushed apart as the monitor is pressed into the block 200 and loose physical contact before the spring loaded switches 205, 206 make physical contact with pads 1302. As such, the first circuit 700 and the second circuit 701 inside the block 200 loose electrical communication with each other as the monitor is installed, but regain electrical communication as the monitor 1301 is pressed deeper into the monitor access opening 204.

Monitor 1301 is illustrated as having two headers 1303 such that the monitor can be configured with different circuitry. For example, the measuring circuitry 1108 of FIG. 11 could be on a removable card that can be installed using one or more headers such as headers 1303. Monitor 1301 is illustrated with circuitry 1304 attached to headers such as headers 1303. In addition, circuitry 1304 has additional headers 1303 so that additional circuitry can be installed.

Figure 14:
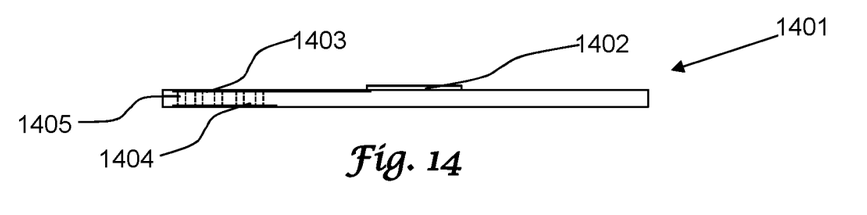
FIG. 14 illustrates a monitor having left and right pads connected by vias in accordance with aspects of the embodiments.

FIG. 14 illustrates a monitor 1401 having left and right pads 1403, 1404 connected by vias 1405 in accordance with aspects of the embodiments. Monitor 1401 passes electrical current between the first and second circuits 700, 701 with almost zero interference (e.g., resistance, impedance, etc.), but can measure electrical parameters such as voltage (ground connection assumed) at measurement circuit 1402.

Figure 15:
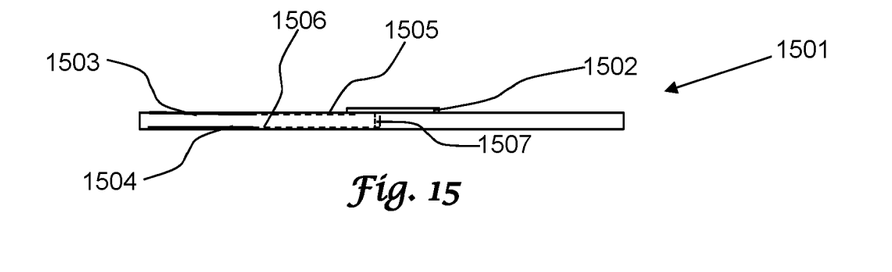
FIG. 15 illustrates a monitor having left and right pads connected to a measuring circuit in accordance with aspects of the embodiments.

FIG. 15 illustrates a monitor 1501 having left and right pads connected to a measuring circuit 1502 in accordance with aspects of the embodiments. Electrical current or signals passing through monitor 1501 must pass through a measurement circuit 1502 which may or may not alter the current or signals. For example, if the signal is a control signal, then the measurement circuit can overwrite the control signal. Current entering the left pad 1503 is passed by trace 1505 to the measuring circuit 1502. Current leaving the measurement circuit 1502 passes through via 1507 to reach the other side, or far side, of the monitor and is then passed by trace 1506 to right pad 1504. Measurement circuit 1502 can be a current measuring circuit which does not significantly impede electric current flowing between the pads, but has a low but calibrated resistance in the current's path.

The monitor can be a populated circuit board with components, such as measurement circuits, traces, vias, and pads. A monitor can obtain power from a battery, parasitically from monitored power or control signals, from a power connection connected to a power source or some other means. A monitor monitoring two or more circuits can be powered by a voltage differential between any combinations of those circuits.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure and all such modifications are intended to be included within the scope of the disclosure.

What is claimed is:

1. A system comprising:
a terminal block comprising a terminal block body, left circuit, and right circuit; wherein the terminal block body comprises a front side, a back side, a right side, a left side, a monitor access opening, a left wire access opening, and a right wire access opening, wherein the left wire access opening is an opening in the left side, and wherein the right wire access opening is an opening in the right side;
wherein the left circuit is located within the terminal block body and comprises a left terminal, a left conductor, and a left spring loaded switch;
wherein the right circuit is located within the terminal block and comprises a right terminal, a right conductor, and a right spring loaded switch;
wherein a first wire that is installed into the left terminal passes through the Sett wire access opening, is fixedly held by the left terminal, and is in electrical communication with the left terminal, left conductor, and left spring loaded switch;
wherein a second wire that is installed into the right terminal passes through the right wire access opening, is fixedly held by the right terminal, and is in electrical communication with the right terminal, right conductor, and right spring loaded switch; wherein the Sett conductor is in physical contact with the left terminal: wherein the right conductor is in physical contact with the right terminal; wherein the left spring loaded blade is in physical contact with the left conductor; wherein the left circuit has a physical connection with the right circuit when a monitor is not installed in the terminal block such that the left circuit is in direct electrical contact with the right circuit; and
wherein, when the monitor is installed in the terminal block, the monitor breaks the physical connection such that the left circuit is in direct physical and electrical contact with the monitor, the right circuit is in direct physical contact with the monitor, and the left circuit electrically communicates with the right circuit through the monitor.

2. The system of claim 1 further comprising the monitor wherein the monitor comprises conductive pads and circuitry arranged to "break before make" such that electrical communications between the first circuit and the second circuit are interrupted as the monitor is installed and as the monitor is removed.

3. The system of claim 1 further comprising the monitor, the monitor comprising:
sensing circuitry that produces a measurement of a first circuit voltage, a second circuit voltage, or of a current wherein the current flows between the first circuit and the second circuit; and
communications circuitry that accepts the measurement and transmits a digital measurement signal based on the measurement.

4. The system of claim 3 further comprising a receiving device wherein the receiving device wirelessly receives the measurement signal and displays the measurement signal to a person.

5. The system of claim 1 further comprising the monitor, wherein the monitor comprises a probe point that is located outside the terminal block when the monitor is installed, wherein the probe point is electrically connected to the first circuit or to the second circuit such that the probe point is at the same voltage as the first circuit or the second circuit.

6. The system of claim 1 further comprising the monitor, wherein the monitor comprises a first probe point and a second probe point;
wherein the first probe point and the second probe point are located outside the terminal block when the monitor is installed;
wherein the first probe point is electrically connected to the first circuit;
wherein the second probe point is electrically connected to the second circuit; and
wherein current flowing between the first circuit and the second circuit must also flow between the first probe point and the second probe point when the monitor is installed.

7. The system of claim 1 further comprising the monitor, the monitor comprising:
sensing circuitry that produces a measurement of a first circuit voltage, of a second circuit voltage, or of a current wherein the current flows between the first circuit and the second circuit; and
display elements wherein the display elements provide a visual indication of a value of the measurement.

8. A method comprising:
inserting a monitor into a monitor access opening of a terminal block wherein the terminal block comprises a terminal block body, left circuit, and right circuit
wherein the terminal block body comprises a front side, a back side, a right side, a left side, a monitor access opening, a left wire access opening, and a right wire access opening, wherein the left wire access opening is an opening in the left side, and wherein the right wire access opening is an opening in the right side;
wherein the left circuit is located within the terminal block body and comprises a left terminal, a left conductor, and a left spring loaded switch;
wherein the right circuit is located within the terminal block and comprises a right terminal and a right conductor;
wherein a first wire that is installed into the left terminal passes through the left wire access opening, is fixedly held by the left terminal, and is in electrical communication with the left terminal, left conductor, and left spring loaded switch;
wherein a second wire that is installed into the right terminal passes through the right wire access opening, is fixedly held by the right terminal, and is in electrical communication with the right terminal and right conductor;
wherein the left conductor is in physical contact with the left terminal;
wherein the right conductor is in physical contact with the right terminal;
wherein the left spring loaded blade is in physical contact with the left conductor;
wherein the left circuit is in direct physical and electrical contact with the right circuit before the monitor is inserted; and
wherein, after the monitor is inserted, the left circuit is in direct physical and electrical contact with the monitor, the right circuit is in direct physical contact with the monitor, and the left circuit electrically communicates with the right circuit through the monitor.

9. The method of claim 8 wherein a second terminal block is positioned next to the terminal block, the method further comprising installing the monitor into the second terminal block while installing the monitor into the terminal block.

10. The method of claim 9 further comprising measuring a voltage difference between a first point on the monitor and a second point on the monitor wherein the first point is electrically connected to the first circuit of the terminal block and wherein the second point is connected to a first circuit of the second terminal block.

11. The method of claim 8 further comprising producing a measurement measuring a voltage of a point on the monitor wherein the point is directly electrically connected to the first circuit.

* * * * *